(12) United States Patent
Goshi

(10) Patent No.: US 7,211,145 B2
(45) Date of Patent: May 1, 2007

(54) SUBSTRATE PROCESSING APPARATUS AND SUBSTRATE PROCESSING METHOD

(75) Inventor: Gentaro Goshi, Tosu (JP)

(73) Assignee: Tokyo Electron Limited, Tokyo-to (JP)

( * ) Notice: Subject to any disclaimer, the term of this patent is extended or adjusted under 35 U.S.C. 154(b) by 507 days.

(21) Appl. No.: 10/422,408

(22) Filed: Apr. 23, 2003

(65) Prior Publication Data
US 2003/0202792 A1   Oct. 30, 2003

(30) Foreign Application Priority Data
Apr. 24, 2002   (JP) ............................. 2002-122190

(51) Int. Cl.
*C30B 29/06* (2006.01)
(52) U.S. Cl. .................. 117/201; 117/202; 118/715 R; 118/718; 118/720; 156/354.1
(58) Field of Classification Search ................ 117/201, 117/202; 118/715 R, 718, 720; 156/345.1
See application file for complete search history.

(56) References Cited

U.S. PATENT DOCUMENTS

| | | | |
|---|---|---|---|
| 4,902,531 A * | 2/1990 | Nakayama et al. | ......... 427/570 |
| 6,478,937 B2 * | 11/2002 | Olgado et al. | ......... 204/297.03 |
| 7,048,824 B1 | 5/2006 | Werfel et al. | |
| 2002/0017910 A1 * | 2/2002 | Sakai | ......................... 324/750 |
| 2003/0201184 A1 * | 10/2003 | Dordi et al. | .................. 205/80 |
| 2004/0139985 A1 * | 7/2004 | Hegedus et al. | ............. 134/1.3 |
| 2004/0194817 A1 * | 10/2004 | Pope et al. | ................. 134/148 |
| 2005/0121328 A1 * | 6/2005 | Shirakashi et al. | ........... 205/96 |

FOREIGN PATENT DOCUMENTS

| | | |
|---|---|---|
| JP | 11-087306 | 3/1999 |
| JP | 2001-060575 | 3/2001 |
| JP | 2001-327936 | 11/2001 |
| WO | WO-00/65637 | 11/2000 |

* cited by examiner

Primary Examiner—Robert Kunemund
(74) Attorney, Agent, or Firm—Morrison & Foerster LLP

(57) ABSTRACT

A substrate processing apparatus include a spin chuck capable of holding a semiconductor wafer in a horizontal position, a drive motor for driving the spin chuck for rotation, and a processing vessel accommodating the spin chuck and the drive motor 50 therein and capable of sealing a supercritical fluid, such as supercritical carbon dioxide, therein. The supercritical fluid flows along the upper and the lower surface of the semiconductor wafer at velocities relative to the upper and the lower surface of the semiconductor wafer as the spin chuck holding the semiconductor wafer in a horizontal position rotates to remove contaminants including particles and adhering to the semiconductor wafer from the semiconductor wafer.

12 Claims, 13 Drawing Sheets

SUBSTRATE PROCESSING APPARATUS AND SUBSTRATE PROCESSING METHOD

BACKGROUND OF THE INVENTION

1. Field of the Invention

The present invention relates to a substrate processing apparatus and method for performing a designated process, such as a cleaning process, drying process, and an etching process, for processing a substrate, such as a semiconductor wafer or a glass substrate for a LCD (liquid crystal display), by using a pressurized fluid, such as a supercritical fluid.

2. Description of the Related Art

Generally, semiconductor device fabricating processes include processes for forming films, such as photoresist films, on semiconductor wafers and processes for removing the films from the wafers.

Use of large-diameter wafers and the reduction of minimum line width are the recent trend of semiconductor device fabricating technology to reduce the manufacturing cost of chips. The price of semiconductor memories, such as DRAMs, has sharply dropped in recent years, and semiconductor device manufacturers, principally of advanced countries, have been shifting to the manufacture of products having higher added values, such as system LSICs. There has been a trend for semiconductor device manufacturers to prefer small-scale multiple-product production to mass production with the change from the production semiconductor devices with low added values to the production of those with high added values. Problems relating to EHS (environment, health and safety) have become important problems to be tackled by the semiconductor device industry. Reduction of injurious industrial wastes and power consumption has become a problem of the utmost importance to be solved by the semiconductor device industry.

The required abilities of semiconductor device fabricating systems and processes have greatly been changing, reflecting such a recent trend of the semiconductor device industry. Semiconductor device fabricating systems are being changed from those of a batch processing system to those of a single-wafer processing system to cope with necessity for wider floor space resulting from the progressively increasing use of large-diameter wafers, to improve the throughput of small-scale multiple-product production systems and to raise device yield. The single-wafer processing system is capable of uniform processing and precision process control. The single-wafer processing system adopts process integration to exclude the effect of external disturbances. Research and development are being made actively for the development of processes to deal with new semiconductor device materials, such as copper and insulating materials having a low dielectric constant, as process technology of the next generation to cope with the progressive reduction of line width.

Although abilities as mentioned above have become important for cleaning apparatuses and resist coating/developing apparatuses, the development of processes that replace wet processes and the reduction of the necessary quantity of volatile organic substances and chemicals are significant problems from the viewpoint of EHS and the process technology of the next generation. Cleaning, drying and etching processes and apparatuses using a supercritical fluid, such as carbon dioxide ($CO_2$) are particularly promising techniques among those recently developed to solve the foregoing problems. Process techniques using a supercritical fluid have become prevalently used in various industries, the effectiveness of supercritical fluids have become widely known. The earth has virtually inexhaustible carbon dioxide, and carbon dioxide is a low-cost industrial material and is a highly safe, harmless, inactive substance. Research and development activities, which have been made up to the present, emphasize the following advantages of supercritical fluids.

1) Properties of supercritical fluid characterized by a surface tension of zero, a density nearly equal to those of liquids and a viscosity nearly equal to those of gases are very effective in processing minute patterns.

2) The solubility of supercritical fluids in organic materials can be greatly increased by using a small amount of solvent with supercritical fluids, which is effective in removing photoresist films and cleaning off residuals.

3) A dissolved substance diffuses at a high diffusion rate and hence uniform processing can be achieved.

4) Supercritical fluids react scarcely with metals, and hence do not damage wiring materials and barrier metals.

5) Supercritical fluids can be discharged from a processing vessel in a gas before taking out a wafer from the processing vessel and hence a drying process is unnecessary.

A supercritical-fluid system using a supercritical fluid for substrate processing is disclosed in Japanese patent laid-open publication Nos. JP 11-87306A. This known supercritical-fluid system supplies a supercritical fluid into a processing vessel accommodating a wafer holding means holding a wafer and capable of rotating the wafer to process the wafer for cleaning, etching and drying. Another substrate processing system, using a supercritical fluid, disclosed in Japanese patent laid-open publication Nos. JP 2001-60575A has a heater embedded in a casing surrounding a processing vessel and heats the processing vessel to control the temperature of the supercritical fluid. Another substrate processing system disclosed in Japanese patent laid-open publication Nos. JP 2001-327936A has a processing vessel provided with a circulation pipe, a fluid is circulated through the circulation pipe by a pump and is heated in a supercritical state by an external heater.

The supercritical-fluid system disclosed in JP 11-87306A has a motor for rotating the substrate holding means, which is disposed outside the processing vessel. Since the high-pressure supercritical fluid is supplied into the processing vessel, the joint of the substrate holding means and the motor in the processing vessel must be provided with a special sealing device, which increases the size of the supercritical-fluid system. Since the wafer is subjected to a cleaning process by rotating the wafer in the processing vessel filled up with a supercritical fluid or a supercritical fluid containing a chemical, particles and organic contaminants adhering to the wafer cannot satisfactorily be removed.

The substrate processing systems disclosed in JP 2001-60575A and JP 2001-327936A have complicated construction because the heater is embedded in the casing surrounding the processing vessel or the pump and the external heater are combined with a circulation pipe disposed outside the processing vessel.

SUMMARY OF THE INVENTION

The present invention has been made in view of the foregoing circumstances and it is therefore an object of the present invention to provide a small, simple substrate processing apparatus having improved processing abilities, and a substrate processing method to be carried out by the substrate processing apparatus.

According to a first aspect of the present invention, a substrate processing apparatus is provided, which includes: a processing vessel having an interior space to be filled with a processing fluid; a substrate holding unit adapted to rotate about an rotational axis while holding a substrate; and a motor that generates a driving force for rotating the substrate holding unit, the motor having a rotor, wherein the substrate holding unit and the rotor of the motor are accommodated in the interior space to be filled with the processing fluid.

The substrate holding unit may include a substrate holding part having a substrate holding member, and a shaft connected to the substrate holding part and extending along the rotational axis, and the rotor of the motor may be fixed to the shaft.

In one preferred embodiment, the motor is an electromagnetic motor having the rotor and a stator, and the stator is arranged around the rotor so that an annular gap is defined between the rotor and the stator, and a liner may be arranged in the annular gap to separate a space on a side of the rotor from a space on a side of the stator, the space on the side of the rotor being a part of the interior space to be filled with the processing fluid, and the liner preventing the processing fluid from penetrating into the space on the side of the stator.

In this case, the stator of the electromagnetic motor maybe a heating means for heating the processing fluid filling up the interior space of the processing vessel.

In one preferred embodiment, the substrate processing apparatus further includes circulation-passage-forming members defining at least one circulation passage configured to guide the processing fluid filling up the interior space of the processing vessel so that the processing fluid, having been fed toward the substrate and having left the substrate, passes through the circulation passage and is fed toward the substrate again.

In one preferred embodiment, the substrate holding unit includes a substrate holding part having a substrate holding member, and a shaft connected to the substrate holding part and extending along the rotational axis; and the circulation passage has a first passage portion and a second passage portion, the first passage portion extending through the shaft of the substrate holding unit and terminating in an outlet opening corresponding to a central part of the substrate held by the substrate holding unit, and the second passage portion being formed around the shaft of the substrate holding unit, and an impellor is arranged on the shaft of the substrate holding unit to force the processing fluid to flow through the circulation passage when the shaft of the substrate holding unit is rotated by the motor.

The substrate holding part may include a base member connected to the shaft, and the substrate holding member may be mounted to the base member to hold the substrate in such a manner that a gap is formed between the base member and the substrate, thereby the processing fluid fed toward the central portion of the substrate flows through the gap between the substrate and the base member toward a periphery of the substrate to be flown into the second passage portion of the circulation passage.

In one preferred embodiment, the substrate processing apparatus is provided with, as said at least one circulation passage, a first circulation passage and a second circulation passage; the substrate holding unit includes a substrate holding part having a substrate holding member, and a shaft connected to the substrate holding portion and extending along the rotational axis; the first circulation passage has a first passage portion extending through the shaft of the substrate holding unit and terminating in an outlet opening corresponding to a central part of a first surface of the substrate held by the substrate holding unit, and a second passage portion formed around the shaft of the substrate holding unit; and the second circulation passage has a first passage portion and a second passage portion, and the first and second passage shares the second passage portion; the first passage portion of the second circulation passage extends outside the processing vessel and terminates in an outlet opening corresponding to a central part of a second surface of the substrate held by the substrate holding unit; and the first passage portion of second circulation passage has an inlet opening connected to the processing vessel to receive the processing fluid flown through the second passage portion of the second circulation passage.

In this case, a heater may be placed in the first supply passage portion of the second circulation passage.

The substrate processing apparatus according to the present invention may be provided with: a supply line connected to the processing vessel to feed the processing fluid from a processing fluid source to the interior space of the processing vessel, the supply line being provided with a valve adapted to open and close the supply line; a compressor, provided in the supply line, adapted to pressurize the processing fluid so that the interior space is filled with the processing fluid in a pressurized state; and a discharge line connected to the processing vessel to discharge the processing fluid from the interior space of the processing vessel, the discharge line being provided with a valve adapted to open and close the discharge line.

In one preferred embodiment, the substrate holding unit is configured to hold the substrate horizontally, the processing vessel has a gate located horizontally outside a position where the substrate is held by the substrate holding unit, and a gate valve is arranged to hermetically close the gate, and a substrate conveyer conveys, through the gate, the substrate between a position outside the processing vessel to the position where the substrate is held by the substrate holding unit.

Preferably, a filter is placed in the circulation passage. In this case, the substrate holding unit includes a substrate holding part having a substrate holding member, and a shaft connected to the substrate holding part and extending along the rotational axis, a part of the circulation passage is formed by a through hole extending through the shaft, and the filter is attached to the shaft at an end of the through hole.

The substrate processing apparatus may further includes a controller that varies operating speed of the motor when the processing fluid is circulated in the circulation passage.

The present invention further provides a substrate processing apparatus, which includes: a processing vessel having an interior space to be filled with a processing fluid; a substrate holding unit adapted to rotate about an rotational axis while holding a substrate, the substrate holding unit provided with a through hole having a first end opened toward the substrate held by the substrate holding unit, and a second end; an impellor arranged on the substrate holding unit, the impellor being configured to rotate together with the substrate holding unit to force the processing fluid filling up the interior space to flow into the through hole via the second end of the through hole and flow out of the through hole toward the substrate via the first end of the through hole, when the substrate holding unit rotates.

According to another aspect of the present invention, a substrate processing method is provided, which includes the steps of: placing a substrate in a processing vessel; filling up the processing vessel with a pressurized processing fluid; rotating the substrate in the processing vessel; causing the processing fluid filling up the processing vessel to flow from a central part of the substrate toward a periphery of the substrate, thereby treating the substrate with the processing fluid; stopping rotating the substrate; and taking the substrate out of the processing vessel.

The step of placing the substrate may include the steps of: opening a gate of the processing vessel; carrying the substrate into the processing vessel through the gate by a substrate conveyer; transferring the substrate from the substrate conveyer to a substrate holding unit configured to rotate while holding the substrate; retracting the substrate conveyer from the processing vessel through the gate; and hermetically closing the gate of the processing vessel.

The pressurized processing fluid may be circulated when the substrate being treated. The processing fluid may be jetted against central parts of both the surfaces of the substrate. A flow of the pressurized processing fluid may be pulsated. The pressurized processing fluid may be carbon dioxide heated at a temperature in a range of 25 to 250° C. and pressurized at a pressure in a range of 6.9 to 40 MPa.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

The present invention will be described as applied to a substrate processing apparatus for processing a semiconductor wafer (hereinafter, referred to simply as "wafer") by a resist film removing process for removing a resist film formed on a surface of a wafer and a cleaning process for cleaning the wafer.

Figure 1:
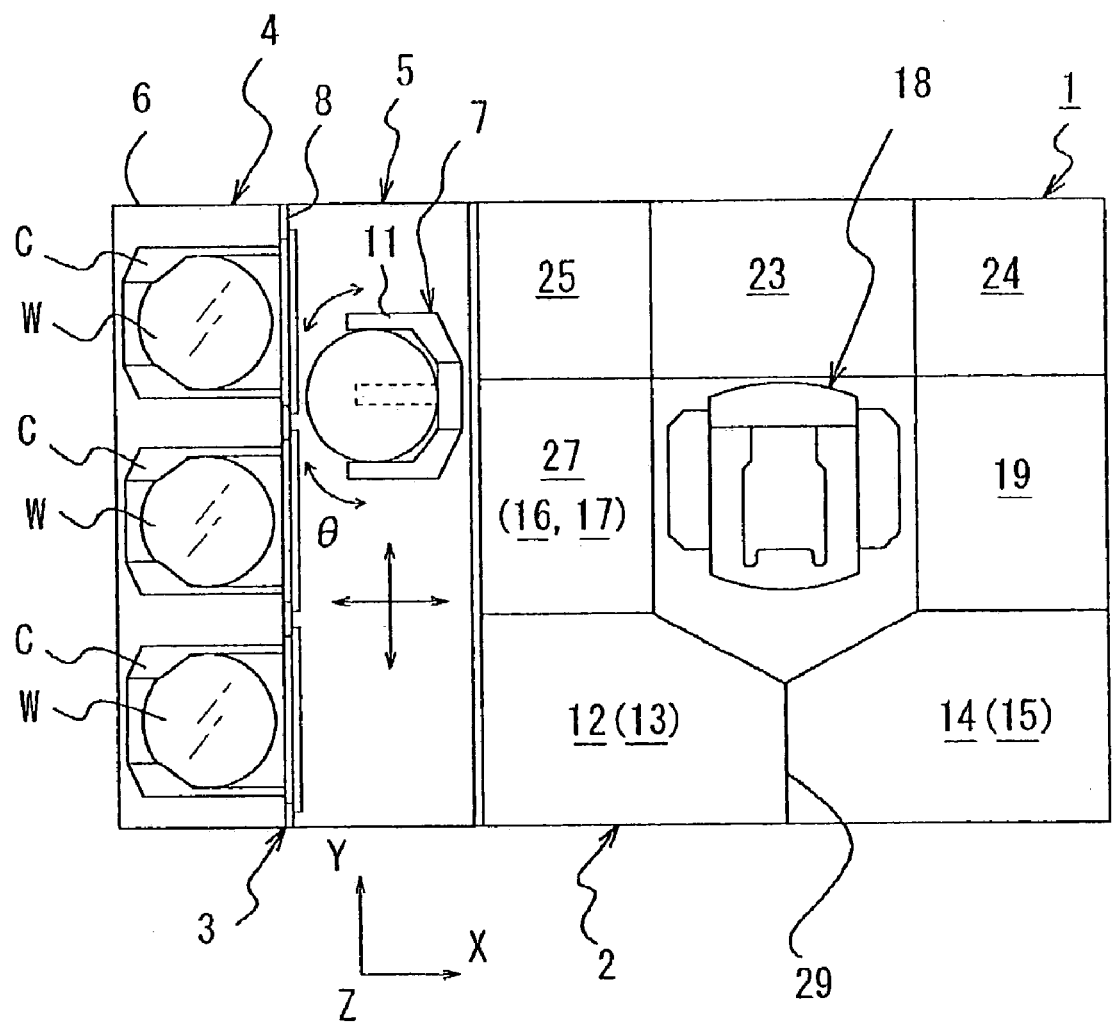
FIG. 1 is a schematic plan view of a wafer processing system for processing a semiconductor wafer, i.e., a substrate processing system, employing a substrate processing apparatus (processing unit) in a first embodiment according to the present invention.
Figure 2:
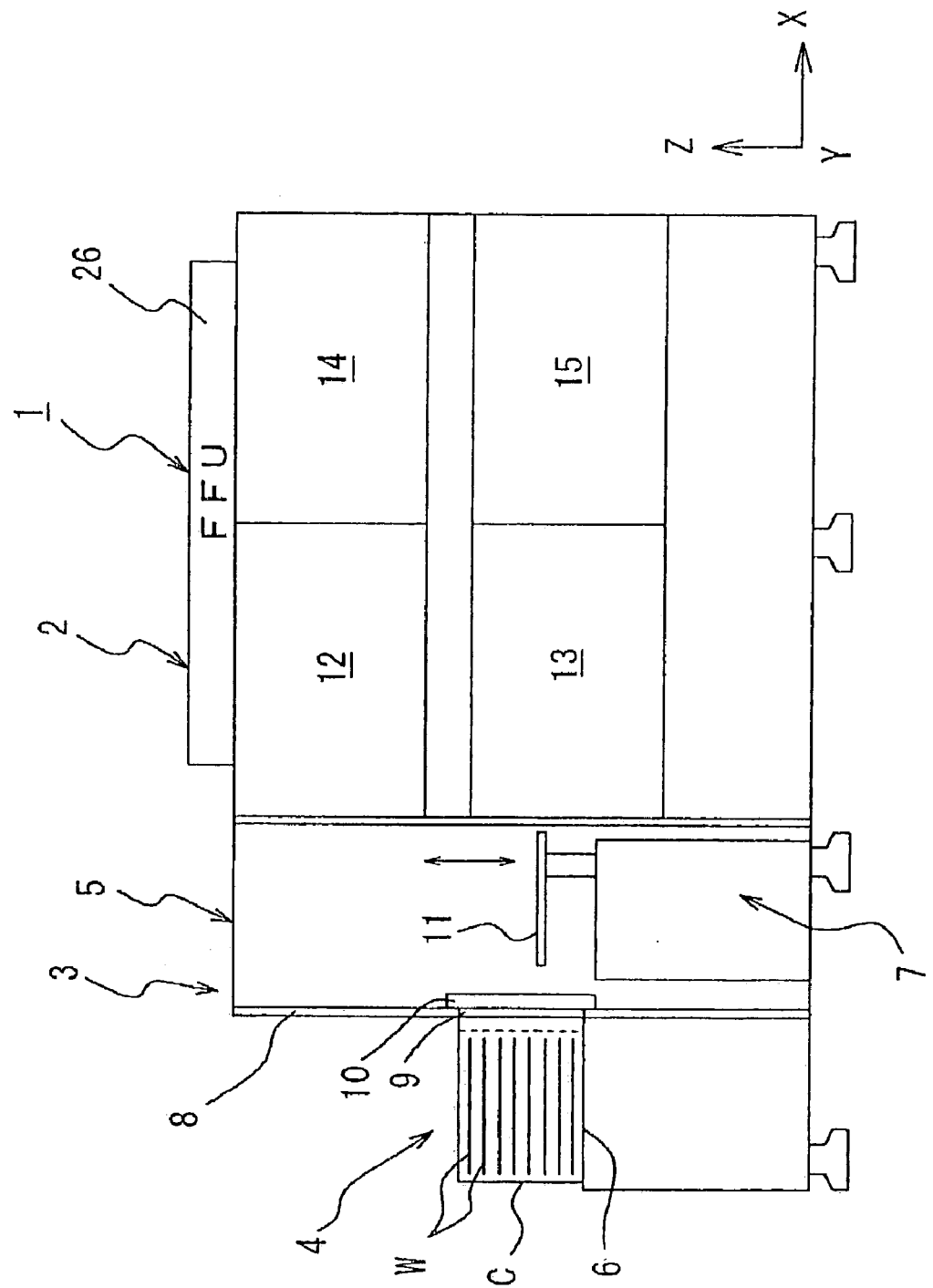
FIG. 2 is a schematic side elevation of the substrate processing system shown in FIG. 1.

Referring to FIGS. 1 and 2 showing a substrate processing system 1, the substrate processing system 1 includes a substrate processing section 2 in a first embodiment according to the present invention for processing a wafers W, and a wafer transfer section 3 for carrying a wafer W into and carrying a wafer W out of the substrate processing section 2.

The wafer transfer section 3 has an in/out port 4 including wafer carriers C each capable of holding, for example, twenty-five processed or unprocessed wafers W, a table 6 for supporting the wafer carriers C thereon, and a wafer carrying unit 5 including a wafer carrying device 7 for transferring wafers W from the wafer carrier C placed on the table 6 to the substrate processing section 2 and vice versa.

The wafer carrier C has one side provided with an opening covered with a cover. The cover of the wafer carrier C is opened to take out wafers W from and to put wafers W into the wafer carrier C. Shelves are supported on the inner surfaces of walls of the wafer carrier C to support wafers W at predetermined intervals. The shelves define, for example, twenty-five slots for accommodating wafers W. One wafer W is inserted in each of the slots with its major surface on which semiconductor devices are to be formed facing up.

For example, three wafer carriers C can be arranged horizontally along the Y-axis at predetermined positions on the table 6 of the in/out port 4. The wafer carrier C is placed on the table 6 with its side provided with the cover faced toward a partition wall 8 separating the in/out port 4 and the waver carrying unit 5. Windows 9 are formed in the partition wall 8 at positions corresponding to the positions where the wafer carriers Care placed on the table 6. Shutters 10 installed on the side of the wafer carrying unit 5 with respect to the windows 9 close the windows 9.

The wafer carrying device 7 placed in the wafer carrying unit 5 is horizontally movable along the Y-axis, is vertically movable along the Z-axis, and is turnable in the θ-direction in a horizontal plane, i.e., XY-plane. The wafer carrying device 7 has a wafer transfer arm 11 capable of holding and carrying a wafer W. The wafer transfer arm 11 is horizontally movable along the X-axis. Thus, the wafer carrying device 7 is capable of accessing every one of the slots, at different levels, of the wafer carrier C placed on the table 6 and each of two vertically arranged wafer delivery units 16 and 17, and of transferring the wafer from the in/out port 4 to the substrate processing section 2 and vice versa.

The substrate processing section 2 includes a main wafer conveyer 18, wafer delivery units 16 and 17 for temporarily holding a wafer W before delivery, wafer reversing units (REV) 27 for reversing a wafer W, four substrate cleaning units 12, 13, 14 and 15, which are the essential components of the substrate processing section 2 of the present invention employed in the substrate processing system 1, three heating units 19, 20 and 21 for drying wafers W by heating, and a cooling unit 22 for cooling a heated wafer W. The main wafer conveyer 18 is able to access the wafer transfer units 16 and 17, the wafer reversing units 27, the wafer cleaning units 12, 13, 14 and 15, the heating units 19, 20 and 21 and the cooling unit 22.

The substrate processing section 2 is provided with a power unit 23 for supplying power to all the components of the substrate processing system 1, a machine control unit 24 for controlling operations of all the components of the substrate processing system 1, and a cleaning medium storage unit 25 storing a processing fluid, such as carbon dioxide ($CO_2$) as a cleaning medium to be supplied to the wafer cleaning units 12, 13, 14 and 15. The power unit 23 is connected to a main power source, not shown. A fan filter unit (FFU) 26 is installed on the top wall of the substrate processing section 2 to supply clean air to those units and the main wafer conveyer 18.

Installation of the power unit 23, the cleaning medium storage unit 25 and the machine control unit 24 outside a back part of the substrate processing section 2 or in an external space facilitates carrying out work for the maintenance of the wafer transfer units 16 and 17, the wafer reversing units 27, the main wafer conveyer 18, the heating units 19, 20 and 21 and the cooling unit 22 from the front side (from the direction along the Y-axis).

Figure 3:
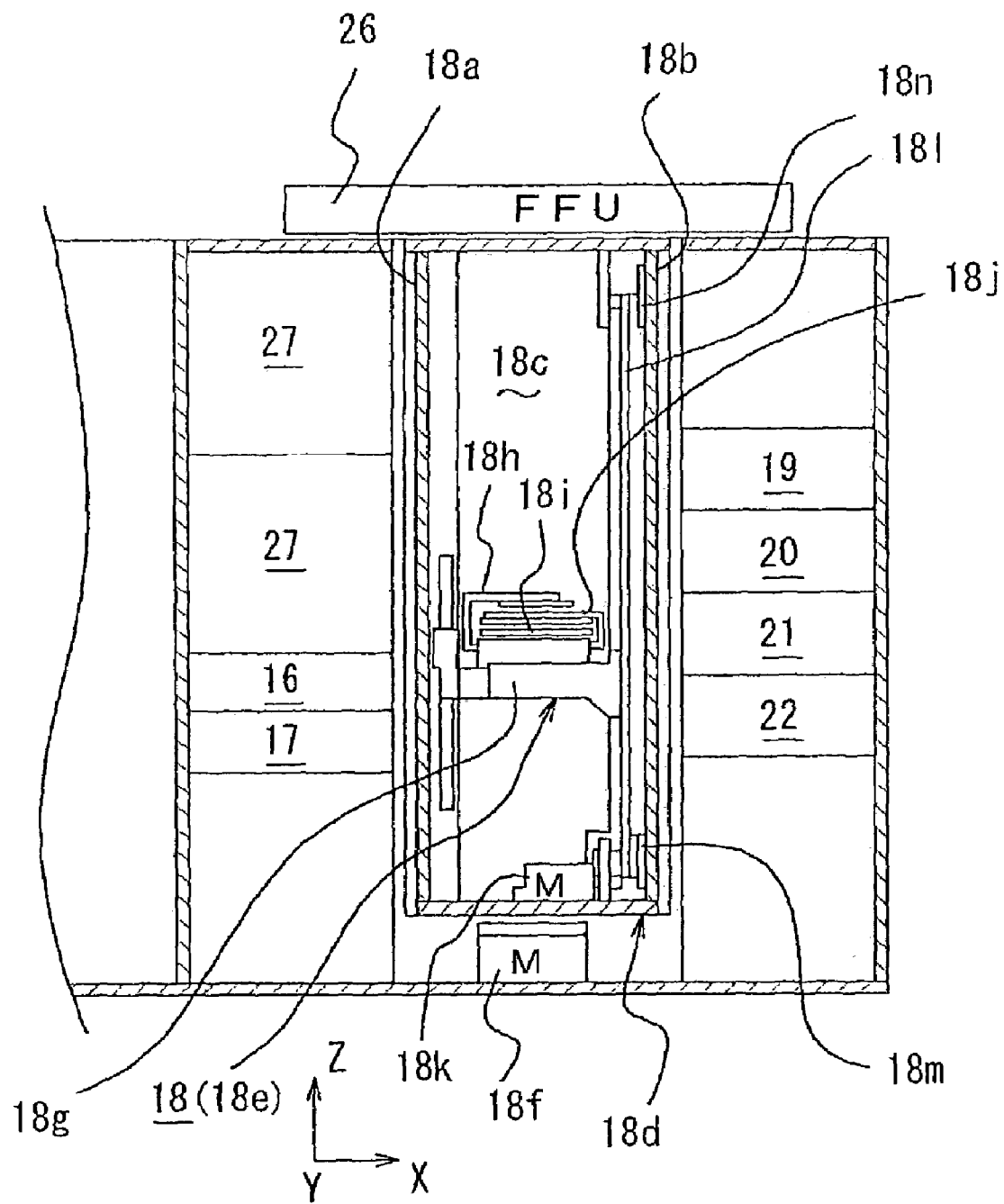
FIG. 3 is a partly cutaway schematic side elevation of a part of the wafer processing system shown in FIG. 1.

FIG. 3 is a schematic sectional view of assistance in explaining the arrangement of the wafer transfer units 16 and 17, the wafer reversing units 27, the main wafer conveyer 18 adjacent, with respect to a direction along the X-axis, to the wafer transfer units 16 and 17, the wafer reversing units 27, the heating units 19, 20 and 21 and the cooling unit 22. The wafer transfer units 16 and 17 are stacked vertically. For example, the lower wafer transfer unit 17, or the wafer relay unit 17, transfers a wafer W from the in/out port 4 to the substrate processing section 2, and the upper wafer transfer unit 16, or the wafer relay unit 16, transfers a wafer W from the substrate processing section 2 to the in/out port 4.

Part of clean air blown downward by the FFU 26 flows through the wafer transfer units 16 and 17 and the waver reversing unit 27, a space extending over the wafer transfer units 16 and 17 and the wafer reversing unit 27 into the wafer carrying unit 5. Thus, contaminants, such as foreign particles, are prevented from migrating from the wafer carrying unit 5 into the substrate processing section 2 to maintain the interior of the substrate processing section 2 clean.

The wafer conveyer 18 includes a tubular support structure 18d having vertical walls 18a and 18b extending along the Z-axis so as to define an open side 18c therebetween, and a wafer carrying unit 18e vertically movable along the Z-axis in the tubular support structure 18d. A motor 18f drives the tubular support structure 18d for turning together with the wafer carrying unit 18e. The wafer carrying unit 18e includes a base 18g, and three carrying arms 18h, 18i and 18j, which are movable along the base 18g. The respective sizes of the carrying arms 18h, 18i and 18j are determined such that the carrying arms 18h, 18i and 18j are able to move through the open side 18c of the tubular support structure 18d. The carrying arms 18h, 18i and 18j can individually be moved by a motor and belt-drive mechanism, which are built in the base 18g. A belt-drive mechanism includes a motor 18k, a drive pulley 18m mounted on the output shaft of the motor 18k, a driven pulley 18n supported on an upper part of the vertical wall 18b of the tubular support structure 18d, and a belt 18l extended between the drive pulley 18m and the driven pulley 18n. The belt-drive mechanism drives the wafer carrying unit 18e for vertical movement.

The three heating units 19, 20 and 21 are stacked on the cooling unit 22 for the forced cooling of a wafer W.

The two wafer cleaning units 12 and 13 are stacked, and the two wafer cleaning units 14 and 15 are stacked. The wafer cleaning units 12, 13, 14 and 15 are substantially similar in construction, except that the two wafer cleaning units 12 and 13, and the two wafer cleaning units 14 and 15 are symmetrical with respect to a wall 29 separating the two wafer cleaning units 12 and 13, and the two wafer cleaning units 14 and 15. Therefore, only the substrate processing unit 12 will be described as a representative example with reference to FIGS. 4 to 13.

First Embodiment

Figure 4:
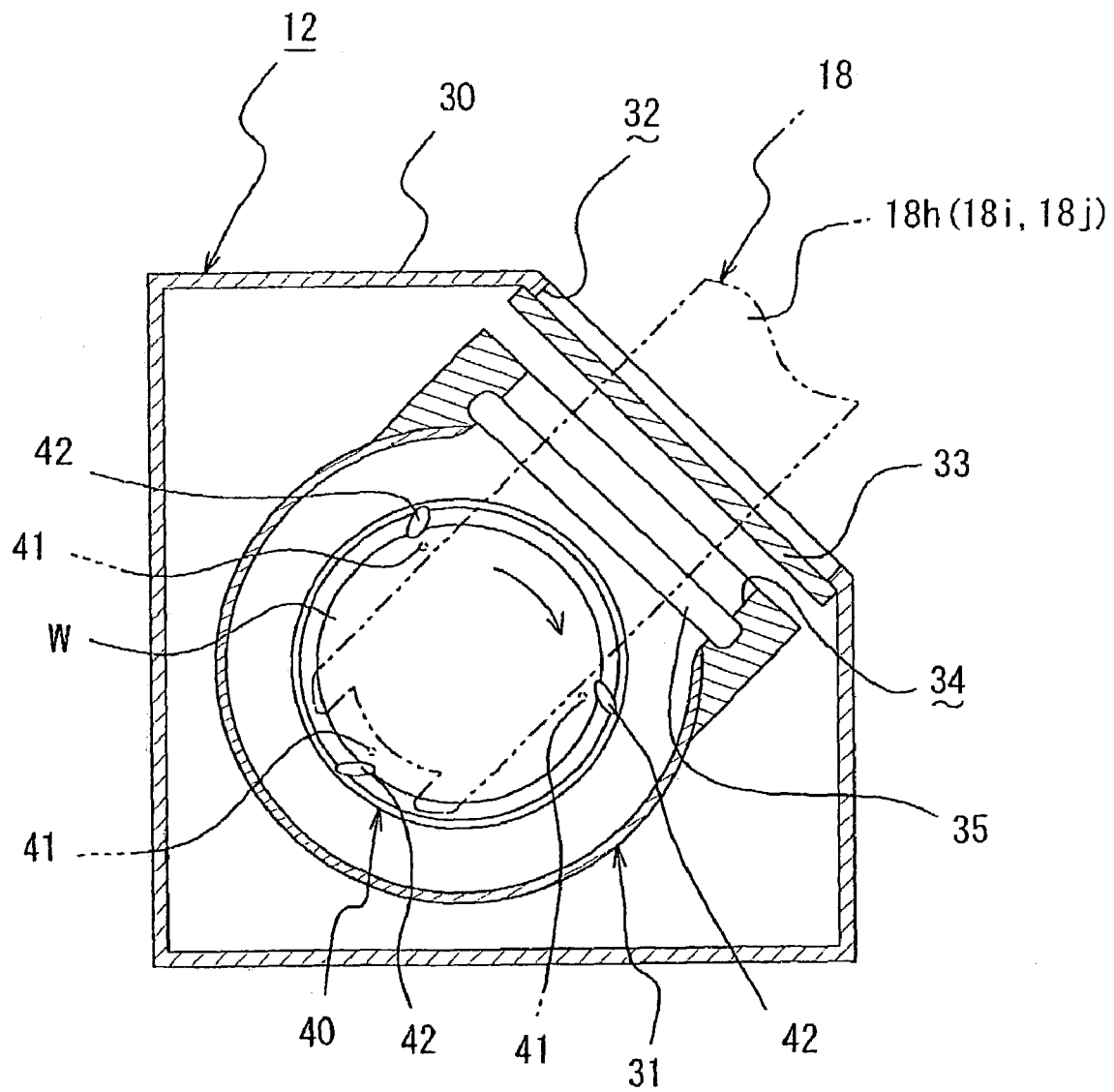
FIG. 4 is a plan view of a substrate cleaning unit included in a substrate processing apparatus in the first embodiment.
Figure 5:
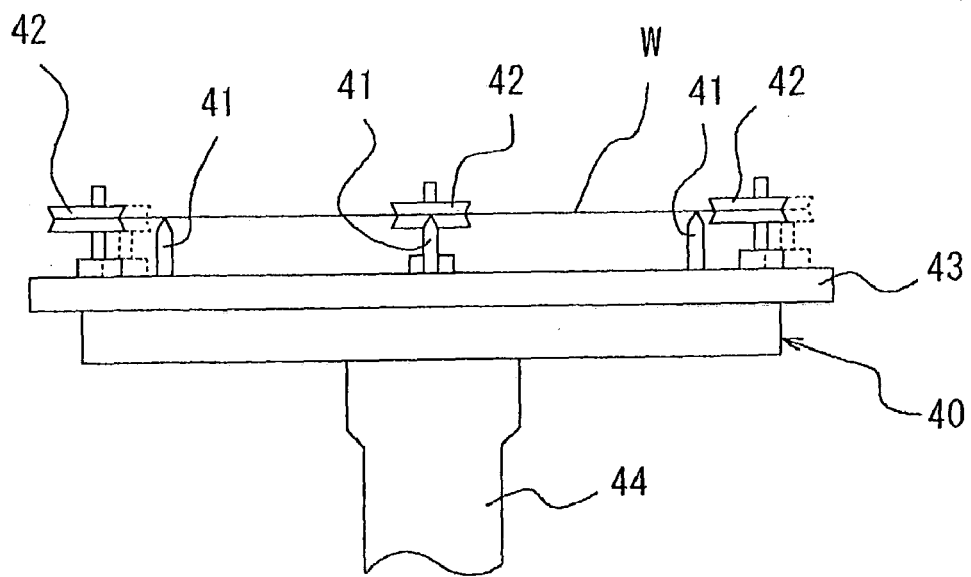
FIG. 5 is a side elevation of a spin chuck in a holding state.
Figure 6:
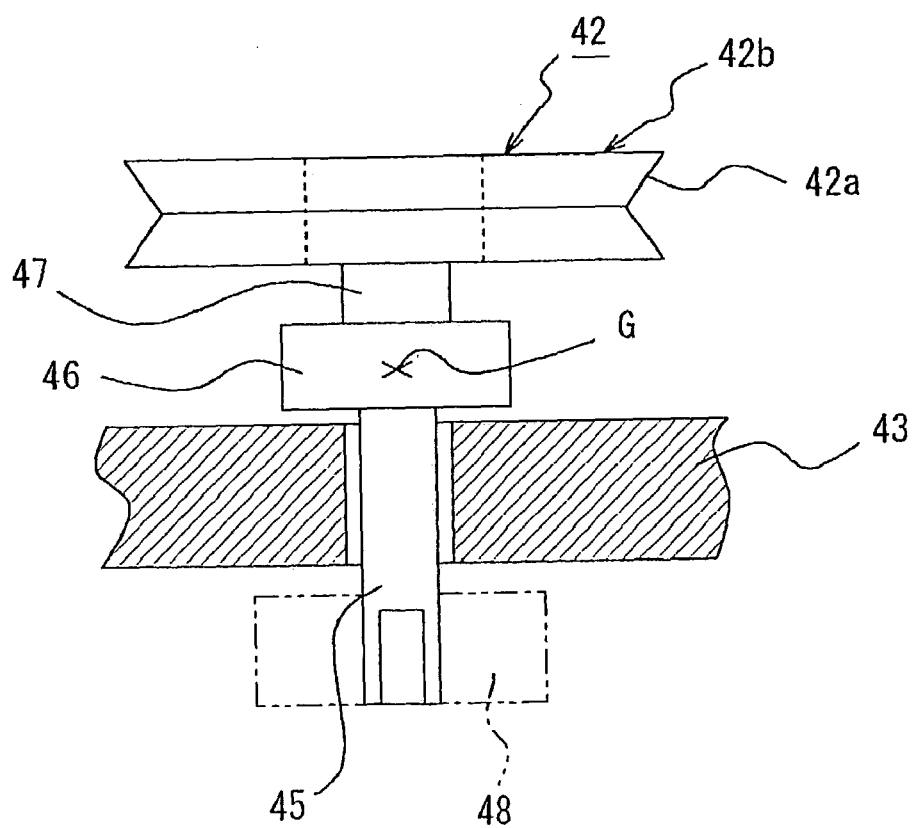
FIG. 6 is a side elevation of a holding mechanism included in the spin chuck shown in FIG. 5.

Referring to FIG. 4 showing the substrate cleaning unit 12 included in the substrate processing section 2 in the first embodiment in a schematic plan view, a processing vessel 31 is disposed in a unit casing 30. The unit casing 30 has one side wall provided with an opening 32, and a shutter 33 closes the opening 32. The shutter 33 is opened by a shutter operating mechanism when the wafer carrying arm carries a wafer W into the substrate cleaning unit 12 and when the same carries out a wafer W from the substrate cleaning unit 12. The shutter 33 is placed on the inner surface of the side wall to prevent the atmosphere in the unit casing 30 from leaking from the unit casing 30 even when the pressure in the unit casing 30 is higher than the atmospheric pressure.

Figure 9:
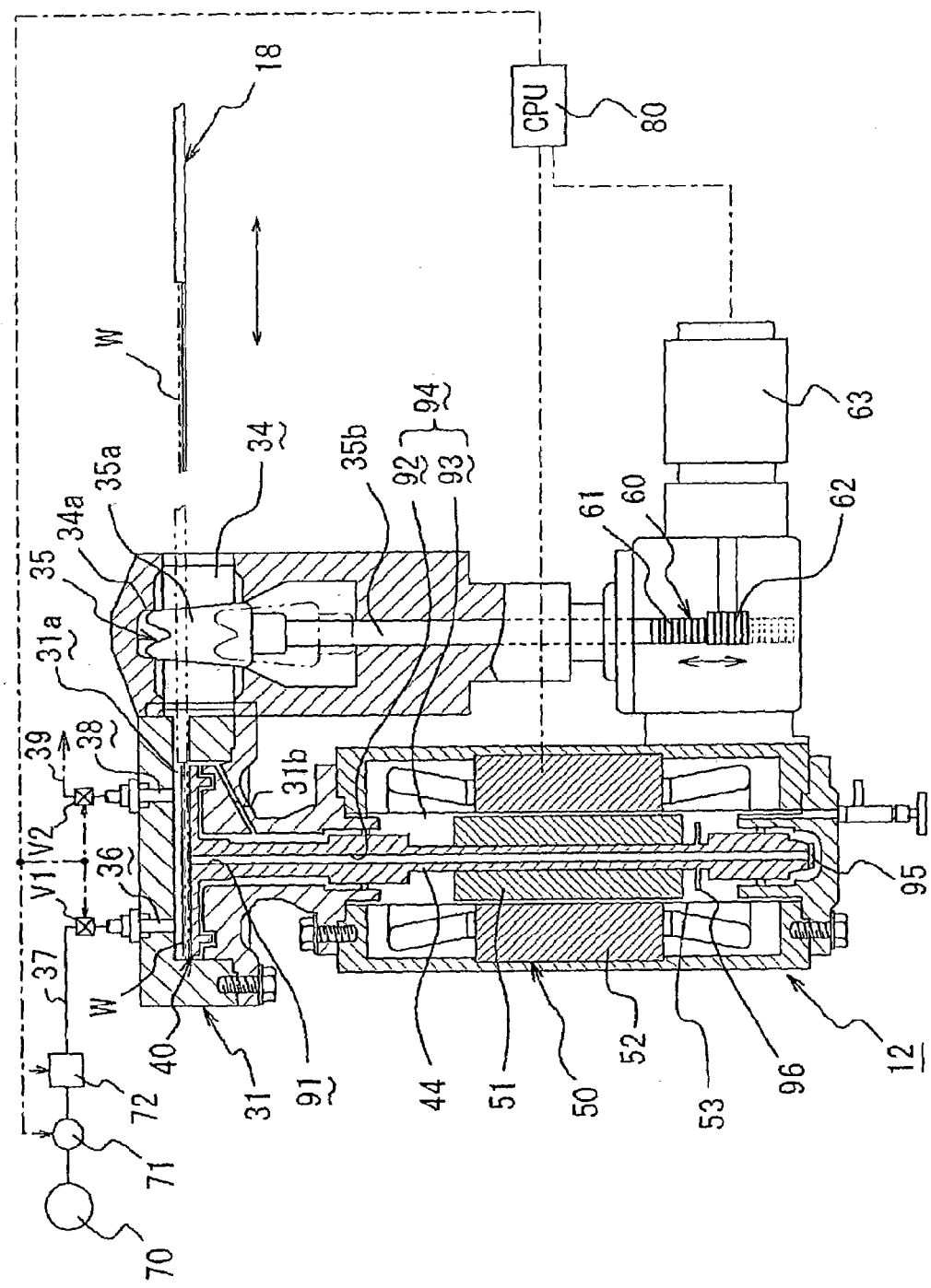
FIG. 9 is a sectional view of the substrate processing unit included in the substrate processing apparatus in the first embodiment.
Figure 10:
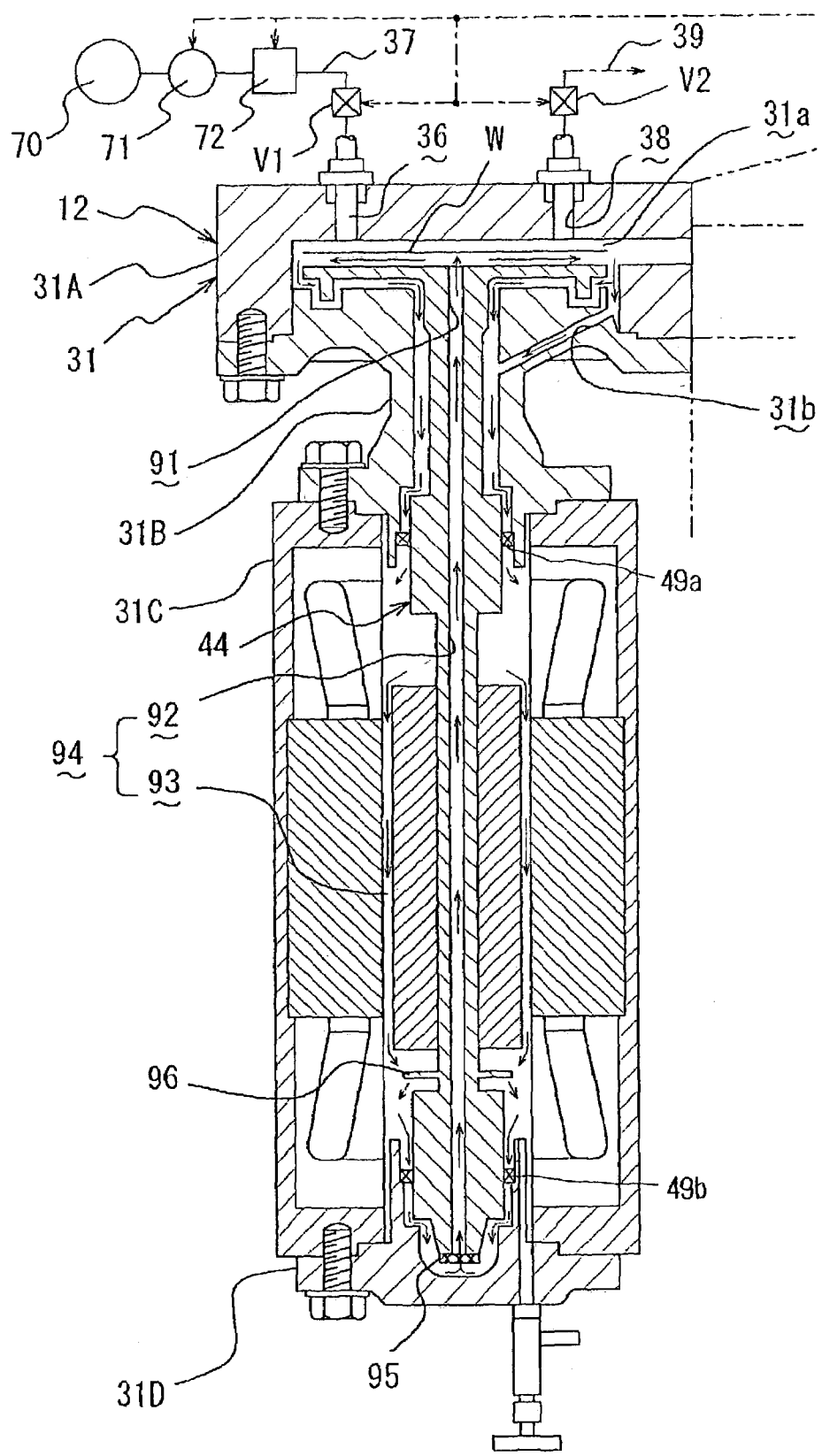
FIG. 10 is a sectional view of an essential part of the substrate processing unit shown in FIG. 9.
Figure 11:
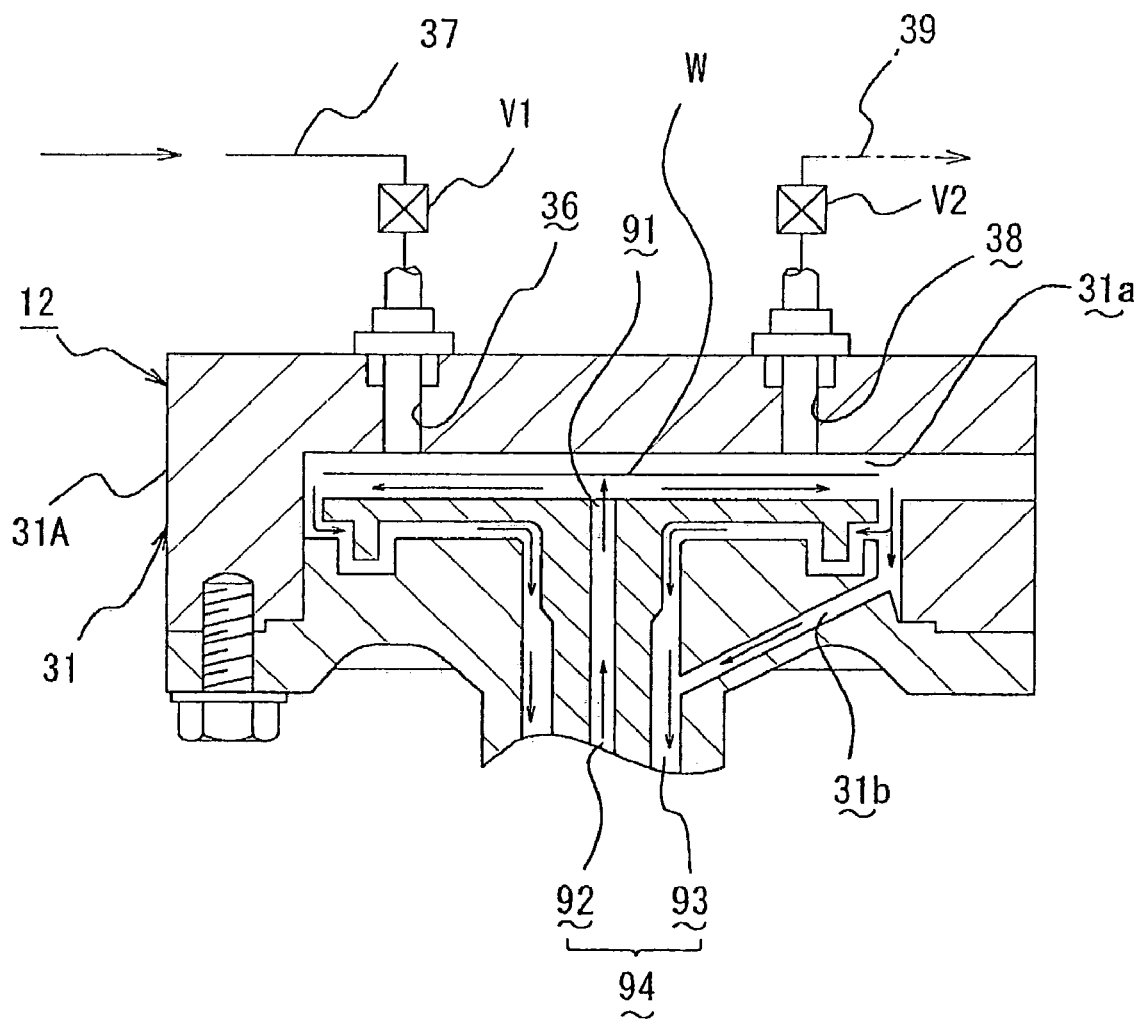
FIG. 11 is an enlarged sectional view of a part of the substrate processing unit shown in FIG. 9 of assistance in explaining the flow of a supercritical fluid in a wafer holding unit.
Figure 12:
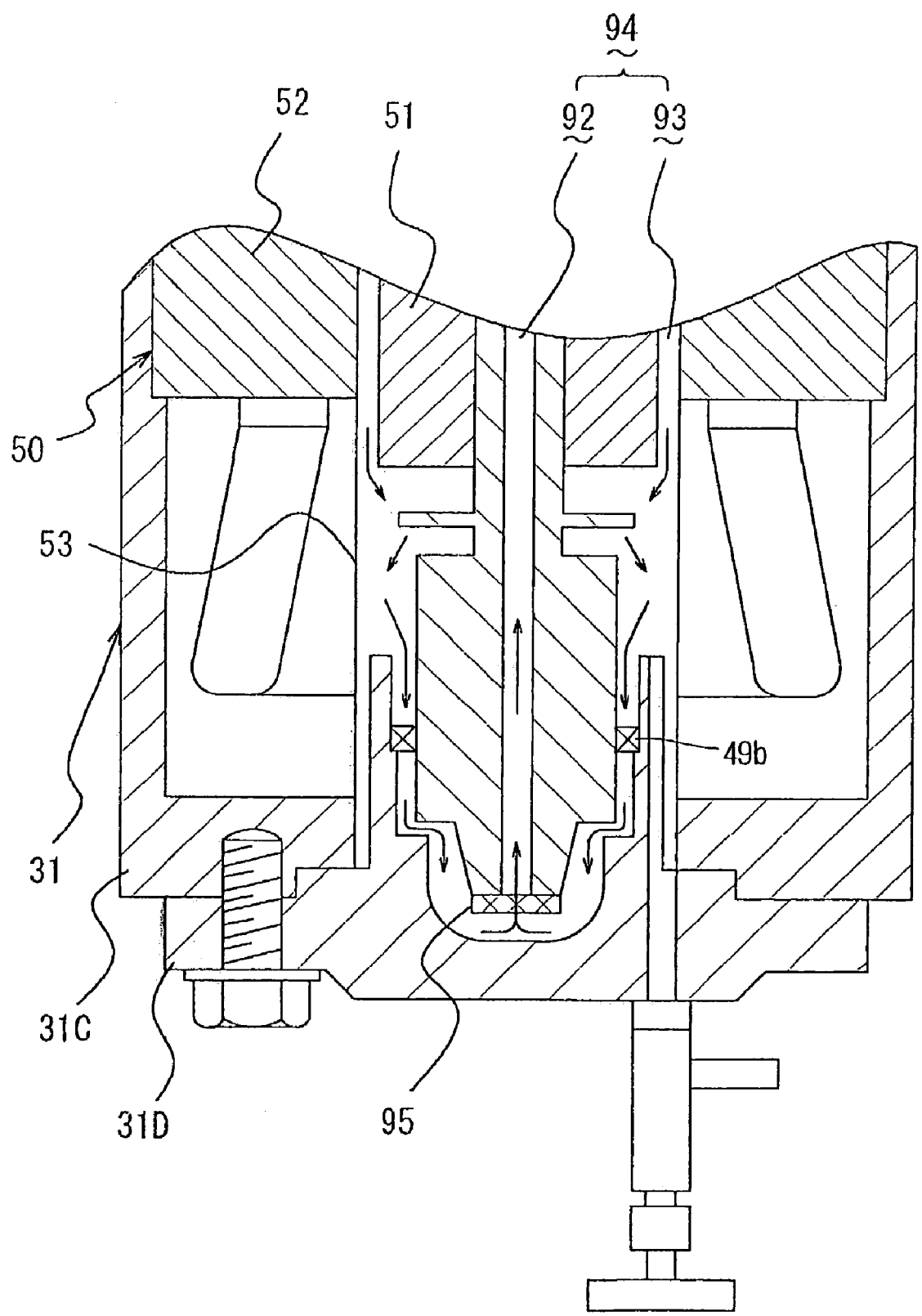
FIG. 12 is an enlarged sectional view a part of the substrate processing unit shown in FIG. 9 of assistance in explaining the flow of the supercritical fluid from a discharge passage into a supply passage.
Figure 13:
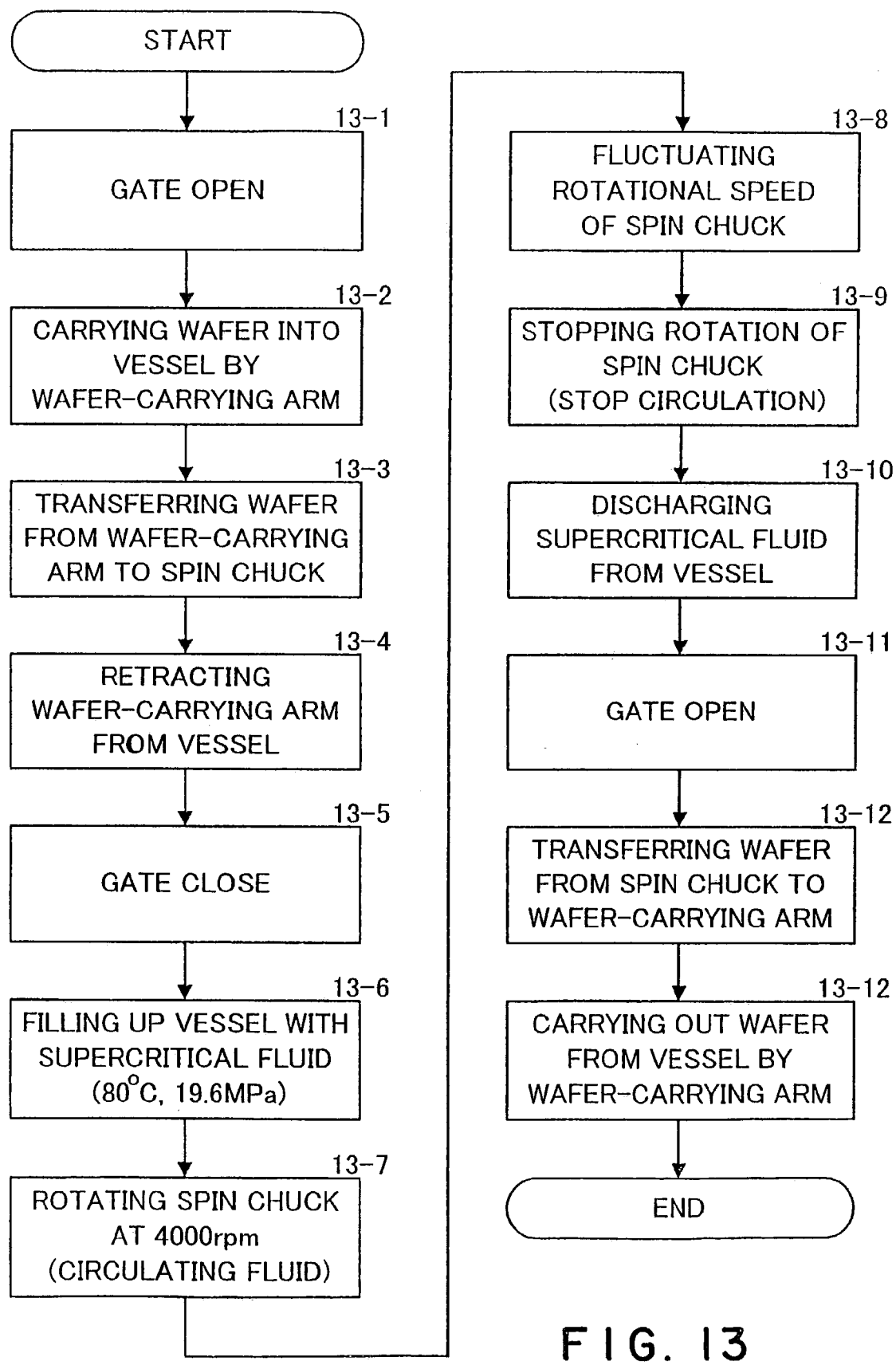
FIG. 13 is a flow chart of a substrate processing method according to the present invention.

Referring to FIGS. 9 and 10, the processing vessel 31 is constructed by hermetically joining together four principal members, i.e., a top member 31A, a neck member 31B, a body member 31C and a bottom member 31D. The top member 31A and the neck member 31B define a processing chamber, or a processing space. A motor 50 is accommodated in the body member 31C.

The processing vessel 31 has an interior space to be filled with a high-pressure fluid, namely a pressurized processing fluid. The interior space includes the processing space. The high-pressure fluid may be a supercritical fluid, a subcritical fluid of a temperature below the critical temperature and a pressure near the critical pressure, or a saturated liquid of a pressure lower than that of a subcritical fluid and having the saturation vapor pressure. In the illustrated embodiment, supercritical carbon dioxide is used as the high-pressure fluid.

A spin chuck (substrate holding unit) 40, which is capable of holding a substrate horizontally and is capable of rotation, is entirely accommodated in the interior space to be filled with the high-pressure fluid. In addition, a rotor 52 of the motor 50 for driving the spin chuck 40 for rotation is accommodated in the interior space to be filled with the high-pressure fluid. Accordingly, there exist no rotary members that penetrate through a wall of the processing vessel 31, and thus it is not necessary to provide any dynamic seals in the processing vessel 31. Therefore, the processing vessel 31 can be completely sealed with static seal elements.

The processing vessel 31 has a side wall provided with a gate 34 on one side of the spin chuck 40. A wafer is carried into and taken out of the processing vessel 31 through the gate 34. The gate 34 is closed by a gate valve 35, which is operated by a valve operating mechanism 60, which will be described later.

A $CO_2$ source 70, or a processing fluid source 70, is connected by a supply line 37 provided with a stop valve V1 to an inlet port 36 formed in the top wall of the processing vessel 31. A compressor 71 and a heater 72 are placed in the supply line 37. The compressor 71 compresses $CO_2$ at a critical pressure in the range of 6.9 to 40 MPa, for example, at 19.6 MPa, at which $CO_2$ is in a supercritical state. The heater 72 heats $CO_2$ at a temperature suitable for the cleaning process in the range of 20 to 250° C.), for example, at 80° C. A discharge line 39 provided with a stop valve V2 is connected to an outlet port 38 formed in the top wall of the processing vessel 31.

As shown in FIGS. 5 to 8, the spin chuck 40 comprises a wafer holding part and a rotary shaft 44. The wafer holding part has a disk-shaped chuck body (base member) 43, or a flange 43, three support pins 41 configured to support a lower surface of a wafer, and three holding device 42 configured to hold peripheral portions of the wafer W supported on the support pins 41. The shaft 44 is connected to a lower surface of the chuck body 43 and extends vertically downwardly.

The three support pins 41 are set upright on the upper surface of the chuck body 43 so as to be in contact with the lower surface of a wafer W at equal angular intervals of 120° C. A wafer W is supported stably on the support pins 41 while the spin chuck 40 is stationary. When wafer holding force of the holding device 42 can be reduced below a certain level by reducing the operating speed of the drive motor 50, a wafer W supported on the support pins 41 is able to turn relative to the support pins 41. Thus, parts of the lower surface of the wafer W that have previously been in contact with the support pins 41 are exposed and can be cleaned to clean the entire lower surface of the wafer W. The operating speed of the drive motor 50 is raised again after the holding force has been reduced to some extent to continue the cleaning process.

The three holding devices 42 are mounted to the chuck body 43 at equal angular intervals of 120° as shown in FIG. 4. The three holding mechanisms 42 hold a periphery of a wafer W.

Referring to FIGS. 5 to 8, each holding device 42 comprises a support shaft 45 extending through the chuck body 43 (base member), a turning member 46 supported by the support shaft 45 above the upper surface of the chuck body 43, a support rod 47 set upright on the turning member 46, a substantially elliptic holding member 42b provided with a V-groove defined by a contact surface 42a and joined to the upper end of the support rod 47, and a blade 48 joined to a lower part projecting from the lower surface of the chuck body 43 of the support shaft 45. The holding member 42b can be turned on the support shaft 45 above the chuck body 43. Thus, the holding member 42b, the support shaft 45 and the blade 48 turn together.

Figure 7:
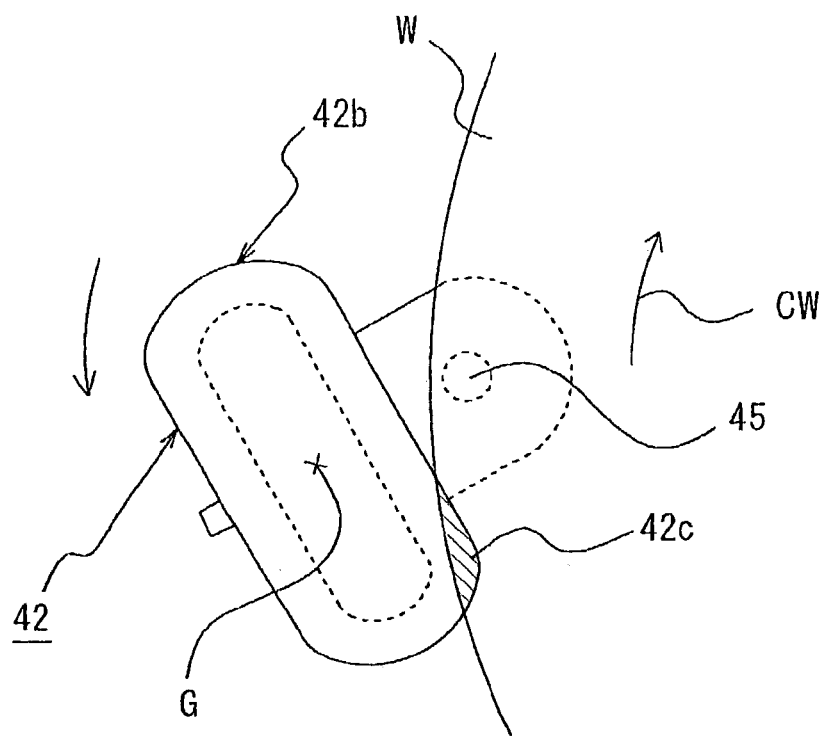
FIG. 7 is a plan view of the holding mechanism shown in FIG. 6.
Figure 8:
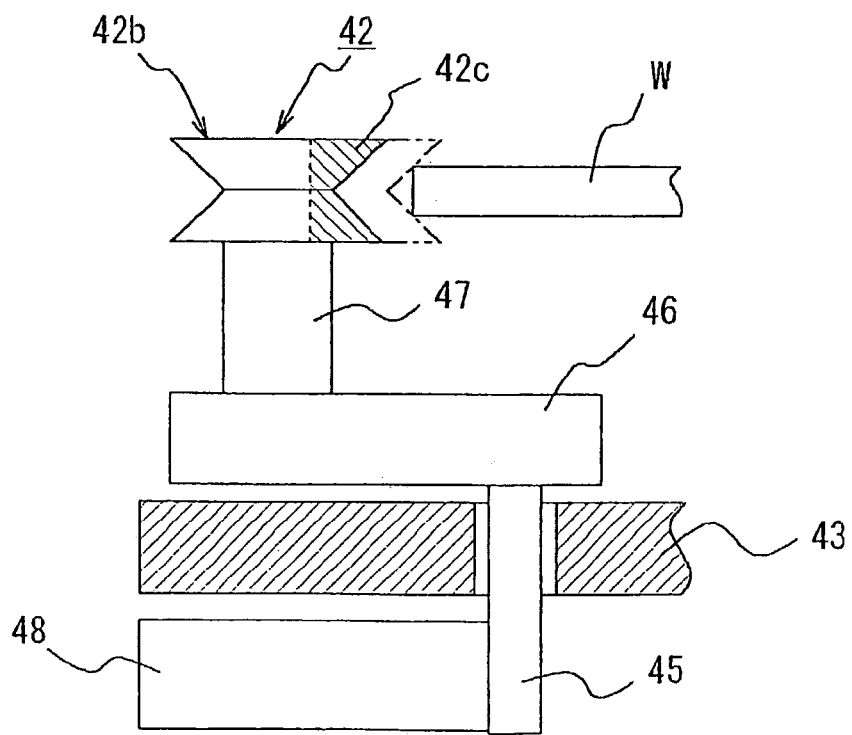
FIG. 8 is a side elevation of the holding mechanism in a wafer holding state.

The holding member 42b of each holding device 42 has a holding part 42c that comes into contact with the periphery of the wafer W when the wafer W rotates together with the spin chuck 40 in a predetermined normal rotating direction, i.e., a clock wise direction CW as viewed in FIG. 7. The holding part 42c is on the side behind the support shaft 45 with respect to the normal rotating direction, i.e., the side shifted in the counterclockwise direction from a position corresponding to the support shaft 45. When the spin chuck 40 rotates in the normal rotating direction, i.e., the clockwise direction CW, wind pressure acts on the blade 48 in the reverse rotating direction, i.e., the counterclockwise direction to exert a turning effect on the support shaft 45 in the reverse rotating direction, i.e., the counterclockwise direction. Consequently, the holding part 42c is urged to come into contact with the periphery of the wafer W as shown in FIG. 7. Thus, the three holding devices 42 apply pressure from three directions to the wafer W to hold the wafer W on the spin chuck 40.

The center G of gravity of the holding device 42 is at a distance from the axis of the support shaft 45. The holding part 42c is at a position behind the center G of gravity with respect to the normal rotating direction. Therefore, a force acts on the holding device 42 to shift the center G of gravity in the reverse rotating direction (counterclockwise direction) when the spin chuck 40 is accelerated for rotation in the normal rotating direction (clockwise direction). Since the center G of gravity is at the distance from the axis of the support shaft 45, the center G of gravity shifts in the reverse rotating direction (counterclockwise direction) when the spin chuck 40 starts rotating in the normal rotating direction (clockwise direction). Consequently, the support shaft 45 is turned in the reverse rotating direction (counterclockwise direction) and the holding part 42c is pressed against the periphery of the wafer W as shown in FIG. 7.

Since the holding member 42b of the holding device 42 is provided with the V-groove defined by the contact surface 42a, the contact surface 42a comes into contact with the upper and the lower edge of the periphery of the wafer W to hold the wafer W securely. Since the area of contact between the holding part 42c and the periphery of the wafer W can be reduced to the least possible extent, irregular processing of the wafer W can be prevented. Re-adhesion of contaminants once removed from the wafer W can be prevented even if the contaminants removed from the wafer W adhere to the holding part 42c. Production of particles due to the contact between the periphery of the waver W and the holding member 42c can be suppressed.

Referring to FIGS. 9 and 10, the drive motor 50 is an electromagnetic motor having a rotor 51 fixed to the shaft 44 of the spin chuck 40, and a stator 52 arranged around the rotor 51 defining an annular gap between the rotor 51 and the stator 52. The stator 52 comprises coils, and the rotor comprises permanent magnets. A cylindrical liner 53 is arranged between the rotor 51 and the stator 52. The cylindrical liner 53 surrounds the shaft 44 and the rotor 51 and engages with the body member 31C of the processing vessel 31 in a airtight, watertight fashion, thereby defining a part of aforesaid interior space of the processing vessel 31 to be filled with a high-pressure fluid, and defining a space containing the stator 52 into which the high-pressure fluid does not penetrate. The cylindrical liner 53 may be made of PEEK (polyetheretherketone) or a nickel-based alloy "hastelloy(registered trademark)".

The drive motor 50 can be used as a heating means for heating the high-pressure fluid because the stator 52 generates heat when a drive current flows through the stator coil when the drive motor 40 operates. Thus, the high-pressure fluid can be maintained at, for example, 80° C. A central processing unit (hereinafter, abbreviated to "CPU") 80 provides control signals to control the operating speed of the drive motor 50 so as to vary in the range of 300 to 30,000 rpm. The shaft 44 is supported for rotation on the cylindrical liner 53 by oilless, or lubrication-free, bearings 49a, 49b. The oilless bearing may be a ceramic ball bearing having bearing balls and inner- and outer-races each made of ceramic material, such as silicon-nitride. The bearing housing for the ceramic ball bearing may be made of PEEK (polyetheretherketone). The high-pressure fluid can pass through the ceramic ball bearing. Thus the ceramic ball bearing does not interrupt the below-mentioned circulation of the high-pressure fluid.

A through-hole extends continuously through the shaft 44 and the chuck body 43 of the spin chuck 40, which are supply-passage forming members. The through-hole is used as a supply passage 92, namely a first passage portion, through which the high-pressure fluid is fed to the substrate. The supply passage 92 terminates in an outlet opening 91 opening toward a central part of the lower surface of a wafer W held by the spin chuck 40.

A discharge passage 93 is formed around the shaft 44 of the spin chuck 40. The discharge passage 93 is defined by discharge-passage forming members, namely the shaft 44, the rotor 52, the processing vessel 31 and the liner 53. The discharge passage 93 is formed between outer surfaces of the shaft 44 and the rotor 52 and inner surfaces of the processing vessel 31 and the liner 53.

The supply passage 92 and the discharge passage 93 form a circulation passage 94. A filter 95 is placed in the circulation passage 94. In the illustrated embodiment, the filter 95 is arranged at an inlet opening of the supply passage 92, namely on the lower end face of the shaft 44.

An impeller 96 is formed on a lower end part of the shaft 44. When the drive motor 50 operates, the impeller 96 impels the supercritical fluid toward the lower end of the shaft 44. When the drive motor 50 is driven to rotate the spin chuck 40 together with the shaft 44 thereof, the supercritical processing fluid (typically, supercritical carbon dioxide) that fills the processing vessel 31 and exists in the discharge passage 93 then is forced to flow toward the lower end of the shaft 44 and through the supply passage 92. Then, the supercritical fluid is jetted toward the central part of the lower surface of the wafer W and is forced to flow through the space between the chuck body 43 and the wafer W toward the periphery of the wafer W by centrifugal force. Eventually, the supercritical fluid flows into the discharge passage 93. Since the supercritical fluid flows from the central part of the lower surface of the wafer W to the periphery of the wafer W, contaminants including particles and adhering to the lower surface of the wafer W can be removed. The supercritical fluid also flows from the central part of the upper surface of the wafer W to the periphery of the wafer W by the centrifugal force, and thus contaminants including particles and adhering to the upper and lower surfaces of the wafer W can be removed.

Supposing that the wafer W is rotated at 4,000 rpm, the velocity, relative to the surface of the wafer W, of the supercritical fluid on the surface of the wafer W at a point at about 7 mm from the center of the wafer W is 300 cm/s. When the supercritical fluid flows at such a velocity and the pressure in the processing vessel 31 is, for example, 30 MPa, contaminants including particles of sizes on the order of 0.03 μm can efficiently be removed from the wafer W. Although the velocity of the supercritical fluid in a central circular area of a radius of about 7 mm having its center at the center of the wafer W in the surface of the wafer W is not high enough to enable the supercritical fluid to remove contaminants from the wafer W, the insufficient contaminant removing effect of the flowing supercritical fluid can be compensated for by jetting the supercritical fluid through the outlet opening 91 of the supply passage 92 directly against the central circular area.

Contaminants including particles removed from the wafer W and contained in the supercritical fluid are filtered by the filter 95 to prevent the re-adhesion of the same to the wafer W. In addition, if particles are produced due to abrasion of the oilless bearings 49a, 49b, such particles are also filtered by the filter 95.

A by pass passage 31b connecting a space 31a accommodating the wafer holding part of the spin chuck 40 and a wafer W to the discharge passage 93 is formed in the processing vessel 31 in addition to the space 31a and the discharge passage 93 connected to the space 31a.

Referring to FIG. 9, the gate valve 35 has a valve element 35a having the shape of a trapezoidal plate and a substantially M-shaped profile tapering toward the upper end, and an operating rod 35b connected to the lower end of the valve element 35a. The valve operating mechanism 60 moves the operating rod 35b vertically to open and close the gate 34. When the valve element 35a closing the gate 34 is seated on an outer valve seat 34a, i.e., a right-hand valve seat as viewed in FIG. 9, the pressure in the processing vessel 31 presses the valve element 35a firmly against the outer valve seat 34a, so that the supercritical fluid supplied into the processing vessel 31 is unable to leak outside.

The valve element 35a of the gate valve 35 does not necessarily need to be formed in the shape of the trapezoidal plate having the M-shaped profile and may be formed in any suitable shape. For example, the gate 34 may be formed in a shape that permits the passage of a wafer carrying arm holding a wafer W, such as a circular, rectangular or elliptic shape, and the valve element 35a may be formed so as to conform to the shape of the gate 34.

The valve operating mechanism 60 includes a rack 61 connected to the lower end of the operating rod 35b of the gate valve 35, a pinion 62 engaged with the rack 61, and a valve operating motor 63 capable of turning the pinion 62 in opposite directions. The valve operating motor 63 drives the pinion 62 for rotation in opposite directions, i. e., normal and reverse directions, to move vertically the operating rod 35b and the valve element 35a through the rack 61 for opening and closing the gate 34. The valve operating motor 63 is electrically connected to the CPU 80. The CPU 80 gives control signals to the valve operating motor 63 to control the operation of the valve operating motor 63. The CPU 80 is connected electrically also to the stop valve V1, the compressor 71 and the heater 72 of the supply line 92, and the stop valve V2 of the discharge line 93 to control those components in an on-off control mode.

Wafer cleaning operations for cleaning a wafer W will be described with reference to FIGS. 9 to 13. The valve operating motor 63 is driven so as to open the gate valve 35 to open the gate 34 of the processing vessel 31 (step 13-1, see FIG. 13). One of the carrying arms 18h, 18i and 18j of the main wafer conveyer 18 carries a wafer W into the processing vessel 31 (step 13-2). The wafer W is transferred to the spin chuck 40 and the spin chuck 40 holds the wafer W in a horizontal position (step 13-3). The carrying arm is retracted from the processing vessel 31 after the wafer W has been transferred to the spin chuck 40 (step 13-4). Then, the valve operating motor 63 is driven so as to rotate the pinion in the reverse direction to close the gate valve 35, and thus the gate 34 is closed (step 13-5).

Subsequently, the compressor 71 and the heater 72 are actuated and the stop valve V1 is opened to supply the supercritical fluid into the closed processing vessel 31, and the stop valve V1 is closed after filling up the processing vessel 31 with the supercritical fluid (step 13-6). In this state, the supercritical fluid has a temperature of, for example about 80° C. and a pressure of, for example, about 19.6 MPa.

Then, the drive motor 50 is actuated to rotate the spin chuck 40 holding the wafer W (step 13-7). Thus, the impeller 96 formed on the shaft 44 of the spin chuck 40 impels the supercritical fluid filling up the processing vessel 31 to flow downward through the discharge passage 93 and to flow upward through the supply passage 92. Thus, the supercritical fluid is jetted toward a central part of the lower surface of the wafer W. The supercritical fluid thus jetted is forced to flow toward the periphery of the wafer W by centrifugal force and flows into the discharge passage 93 (step 13-7, see FIGS. 10 to 12). Consequently, contaminants including particles and adhering to the upper and the lower surfaces of the wafer W can be removed, as mentioned above.

The operating speed of the drive motor 50 corresponding to the rotating speed of the spin chuck 40 is varied so that the velocity of the supercritical fluid pulsate to remove contaminants including particles and adhering to the surfaces of the wafer W further efficiently (step 13-8).

After the continuation of the cleaning process for a predetermined time, the drive motor 50 is stopped to stop the spin chuck 40 holding the wafer Wand to stop the circulation of the supercritical fluid (step 13-9). Then, the stop valve V2 is opened to discharge the supercritical fluid into the atmosphere (step 13-10). After the supercritical fluid has been discharged into the atmosphere, the valve operating motor 63 is actuated to open the gate valve 35 so that the gate 34 is opened (step 13-11). The carrying arm of the main wafer conveyer 18 is advanced into the processing vessel 31, the carrying arm picks up the wafer W from the spin chuck 40 (step 13-12), and then the carrying arm is retracted from the processing vessel 31 to carry out the wafer W (step 13-13).

The wafer W having been cleaned according to the above steps is conveyed to the wafer delivery unit, is transferred to the wafer carrying arm 11, and is contained in the carrier C again.

Second Embodiment

Figure 14:
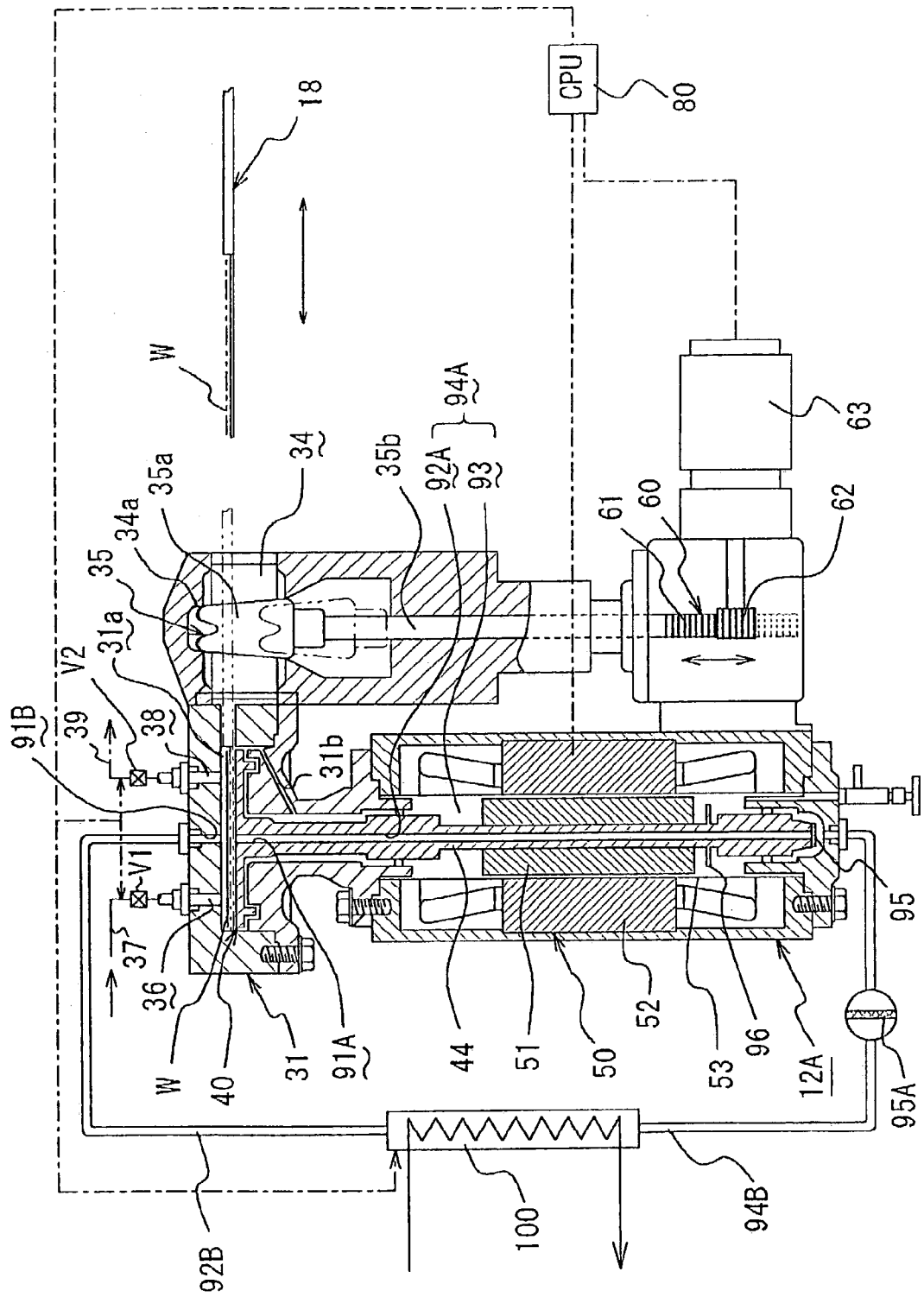
FIG. 14 is a sectional view of a substrate processing unit included in a substrate processing apparatus in a second embodiment according to the present invention.

FIGS. 14 shows a substrate processing unit (a substrate processing apparatus) in a second embodiment according to the present invention in a sectional view, in which parts like or corresponding to those of the first embodiment are denoted by the same reference characters and the description thereof will be omitted.

The second embodiment improves cleaning efficiency as compared with the first embodiment. A substrate cleaning unit 12A is provided with a first circulation passage 94A and a second circulation passage 94B. The first circulation passage 94A is essentially the same as the circulation passage 94 of the first embodiment, and has a supply passage 92A extending through the shaft 44 of the spin chuck 40 and terminating in a first outlet 91A opening toward a central part of the lower surface of a wafer W held on the spin chuck 40 and a discharge passage 93 formed around the shaft 44 of the spin chuck 40. The second circulation passage 94B has an external supply passage 92B that is defined by a pipe (i.e., a supply-passage forming member) connected to the top and the bottom of a processing vessel 31 and having a second outlet 91B opening toward a central part of the upper surface of the wafer W held on the spin chuck 40, and the discharge passage 93 shared with the first circulation passage 94A and the second circulation passage 94B.

A filter 95A is placed in the external supply passage 92B to filter out contaminants including particles and contained in a supercritical fluid, such as supercritical carbon dioxide, therefrom. A heater 100 is placed in the external supply passage 92B to maintain the supercritical fluid flowing through the external supply passage 92A at a predetermined temperature, such as 80° C. A CPU 80 electrically connected to the heater 100 gives a control signal to the heater 100 to control the heater 100 for on-off operation.

Figure 15:
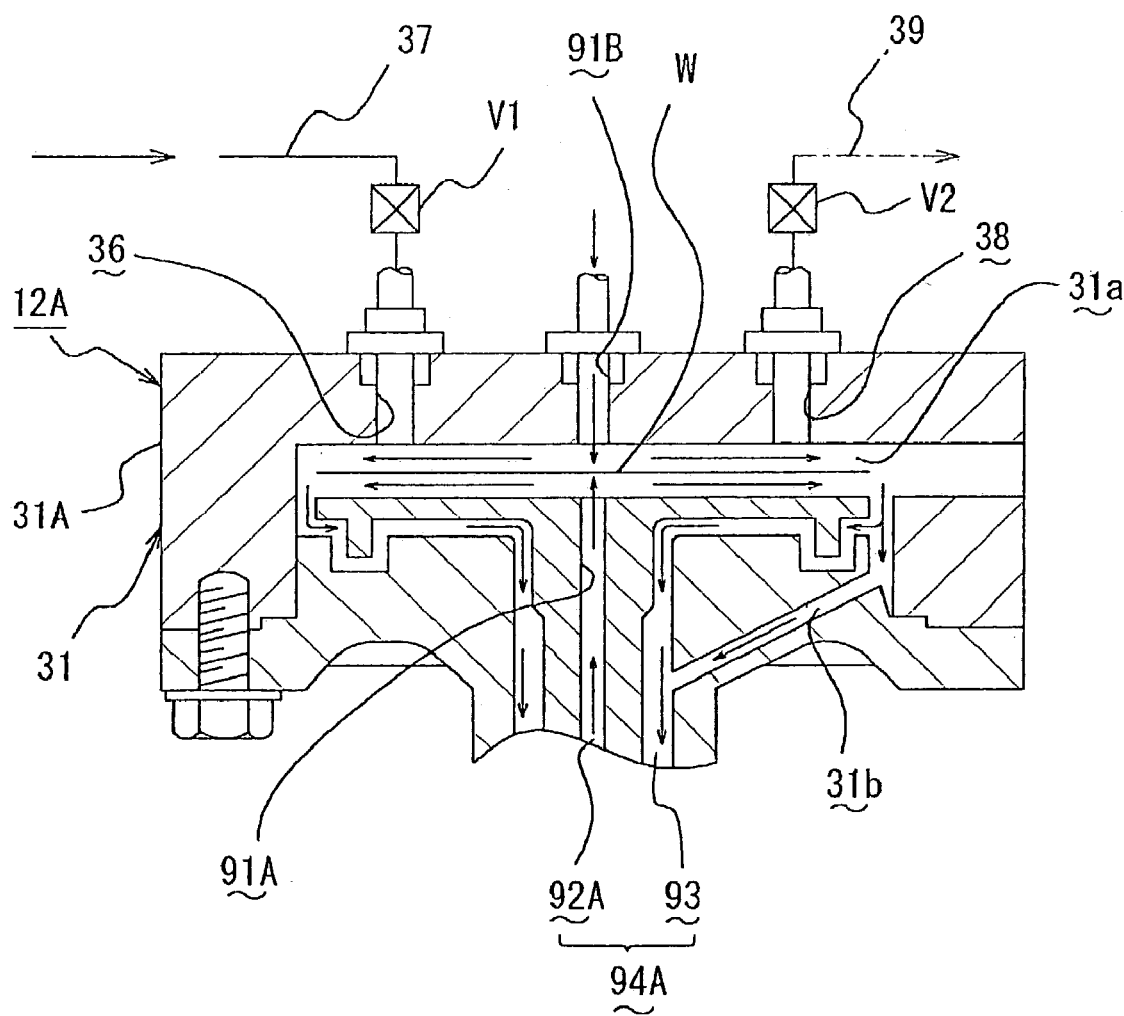
FIG. 15 is an enlarge sectional view of assistance in explaining the flow of a supercritical fluid through a wafer holding unit included in the substrate processing unit shown in FIG. 14.

When the drive motor 50 drives the spin chuck 40 for rotation, the impeller 96 impels the supercritical fluid filling up the processing vessel 31 toward the lower end of the shaft 44. Then, the supercritical fluid flows through the supply passage 92A and the external supply passage 92B. The supercritical fluid is jetted through the first outlet 91A toward a central part of the upper surface of the wafer W, and through the second outlet 91B toward a central part of the lower surface of the wafer W as best shown in FIG. 15. Then, the supercritical fluid is forced to flow along the upper and the lower surface of the wafer W toward the periphery of the wafer W by centrifugal force, and flows into the discharge passage 93. Since the supercritical fluid flows from the central parts of the upper and the lower surface of the wafer W toward the periphery of the wafer W, contaminants including particles and adhering to the upper and the upper and the lower surface of the wafer W can be removed.

Supposing that the wafer W is rotated at 4000 rpm, the velocity, relative to the surfaces of the wafer W, of the supercritical fluid on the surface of the wafer W at a point at about 7 mm from the center of the wafer W is 300 cm/s. When the supercritical fluid flows at such a velocity and the pressure in the processing vessel 31 is 30 MPa, contaminants including particles of size son the order of 0.03 μm and adhering to the upper and the lower surface of the wafer W can efficiently be removed. Although the velocity of the supercritical fluid in central circular areas of a radius of about 7 mm having its center at the center of the wafer W in the upper and the lower surface of the wafer W is not high enough to enable the supercritical fluid to remove contaminants from the wafer W, the insufficient contaminant removing effect of the flowing supercritical fluid can be compensated for by jetting the supercritical fluid through the first outlet opening 91A of the supply passage 92A and the second outlet opening 91B of the external supply passage 92B directly against the central circular areas in the upper and the lower surface of the wafer W. Thus, the second embodiment is capable of more efficiently removing contaminants including particles and adhering to the upper and the lower surface of the wafer W.

Other Uses of the Apparatus

Although the substrate processing apparatus of the present invention has been described as applied to removing contaminants including particles and adhering to the wafer W by using supercritical carbon dioxide, the substrate processing apparatus of the present invention is applicable to various other uses. The substrate processing apparatus is applicable to carrying out processes using a supercritical fluid or a supercritical fluid containing chemicals other than the cleaning process. For example, the substrate processing apparatus of the present invention is applicable to carrying out a developing process using a supercritical fluid, a resist-film forming process (spin-coating process) using a saturated liquid $CO_2$ containing a $CO_2$-soluble polymer resist, such as a fluoropolymer or a fluoroacrylic polymer, a metal-film forming process using a supercritical fluid containing an organic or inorganic compound and hydrogen, an etching process using a supercritical fluid containing an etchant, processes using a supercritical carbon dioxide containing, for example, 1% polypropylene carbide for removing resist-films, organic contaminants and polymers, and processes using a supercritical fluid containing a chelate compound or an acid for removing metal oxide films and metallic contaminants.

Thus, the substrate processing apparatus of the present invention is capable of carrying out combined processes respectively using proper supercritical fluids for forming a resist film on wafers, developing a resist film formed on wafers, removing a resist film from wafers, and removing organic contaminants, polymers metal oxides and metallic contaminants from wafers. Although the substrate processing apparatus of the present invention has been described as applied to a substrate processing system including substrate processing units for removing a resist film from wafers and cleaning wafers, naturally, the present invention is applicable to a substrate processing apparatus for processing substrates other than semiconductor wafers, such as substrates for LCDs.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A substrate processing apparatus comprising:
a processing vessel having an interior space to be filled with a processing fluid;
a substrate holding unit adapted to rotate about a rotational axis while holding a substrate;
a motor that generates a driving force for rotating the substrate holding unit, the motor having a rotor; and
circulation-passage-forming members defining at least one circulation passage configured to guide the processing fluid filling up the interior space of the processing vessel so that the processing fluid, having been fed toward the substrate and having left the substrate, passes through the circulation passage and is fed toward the substrate again; wherein
the substrate holding unit and the rotor of the motor are accommodated in the interior space to be filled with the processing fluid; wherein
the substrate holding unit includes a substrate holding part having a substrate holding member, and a shaft connected to the substrate holding part and extending along the rotational axis; and
the circulation passage has a first passage portion and a second passage portion, the first passage portion extending through the shaft of the substrate holding unit and terminating in an outlet opening corresponding to a central part of the substrate held by the substrate holding unit, and the second passage portion being formed around the shaft of the substrate holding unit; and wherein
said apparatus further comprising;
an impellor arranged on the shaft of the substrate holding unit to force the processing fluid to flow through the circulation passage when the shaft of the substrate holding unit is rotated by the motor.

2. The apparatus according to claim 1, wherein the substrate holding part includes a base member connected to the shaft, and the substrate holding member is mounted to the base member to hold the substrate in such a manner that a gap is formed between the base member and the substrate, thereby the processing fluid fed toward the central portion of the substrate flows through the gap between the substrate and the base member toward a periphery of the substrate to be flown into the second passage portion of the circulation passage.

3. The apparatus according to claim 1, wherein the stator of the electromagnetic motor is capable of serving as a heating means for heating the processing fluid filling up the interior space of the processing vessel.

4. The apparatus according to claim 1, wherein a filter is placed in the circulation passage.

5. The apparatus according to claim 4, wherein:
the substrate holding unit includes a substrate holding part having a substrate holding member, and a shaft connected to the substrate holding part and extending along the rotational axis;
a part of the circulation passage is formed by a through hole extending through the shaft; and the filter is attached to the shaft at an end of the through hole.

6. The apparatus according to claim 1 further comprising a controller that varies operating speed of the motor when the processing fluid is circulated in the circulation passage.

7. A substrate processing apparatus comprising:
a processing vessel having an interior space to be filled with a processing fluid;
a substrate holding unit adapted to rotate about a rotational axis while holding a substrate; and
a motor that generates a driving force for rotating the substrate holding unit, the motor having a rotor; and
circulation-passage-forming members defining at least one circulation passage configured to guide the processing fluid filling up the interior space of the processing vessel so that the processing fluid, having been fed toward the substrate and having left the substrate, passes through the circulation passage and is fed toward the substrate again; wherein
the substrate holding unit and the rotor of the motor are accommodated in the interior space to be filled in the processing fluid; wherein
said apparatus is provided with, as said at least one circulation passage, a first circulation passage and a second circulation passage;
the substrate holding unit includes a substrate holding part having a substrate holding member, and a shaft connected to the substrate holding portion and extending along the rotational axis;
the first circulation passage has a first passage portion extending through the shaft of the substrate holding unit and terminating in an outlet opening corresponding to a central part of a first surface of the substrate held by the substrate holding unit, and a second passage portion formed around the shaft of the substrate holding unit; and
the second circulation passage has a first passage portion and a second passage portion, wherein the second passage portion of the first circulation passage and the second passage portion of the second circulation passage overlap;
the first passage portion of the second circulation passage extends outside the processing vessel and terminates in an outlet opening corresponding to a central part of a second surface of the substrate held by the substrate holding unit; and
the first passage portion of second circulation passage has an inlet opening connected to the processing vessel to receive the processing fluid flown through the second passage portion of the second circulation passage; and wherein
said apparatus further comprising;
an impellor arranged on the shaft of the substrate holding unit to force the processing fluid to flow through the circulation passages when the shaft of the substrate holding unit is rotated by the motor.

8. The apparatus according to claim 7, wherein a heater is placed in the first supply passage portion of the second circulation passage.

9. A substrate processing apparatus comprising:
a processing vessel having an interior space to be filled with a processing fluid;
a substrate holding unit adapted to rotate about an rotational axis while holding a substrate, the substrate holding unit provided with a through hole having a first end opened toward the substrate held by the substrate holding unit, and a second end; and an impellor arranged on the substrate holding unit, the impellor being configured to rotate together with the substrate holding unit to force the processing fluid filling up the interior space to flow into the through hole via the second end of the through hole and flow out of the through hole toward the substrate via the first end of the through hole, when the substrate holding unit rotates.

10. A substrate processing apparatus comprising:

a processing vessel having an interior space to be filled with a processing fluid;

a substrate holding unit adapted to rotate about an rotational axis while holding a substrate; and a motor that generates a driving force for rotating the substrate holding unit, the motor having a rotor; and circulation-passage-forming members defining at least one circulation passage configured to guide the processing fluid filling up the interior space of the processing vessel so that the processing fluid, having been fed toward the substrate and having left the substrate, passes through the circulation passage and is fed toward the substrate again, wherein:

the substrate holding unit and the rotor of the motor are accommodated in the interior space to be filled with the processing fluid;

the substrate holding unit includes a substrate holding part having a substrate holding member, and a shaft connected to the substrate holding part and extending along the rotational axis; and the circulation passage has a first passage portion and a second passage portion, the first passage portion extending through the shaft of the substrate holding unit and terminating in an outlet opening corresponding to a central part of the substrate held by the substrate holding unit, and the second passage portion being formed around the shaft of the substrate holding unit.

11. The apparatus according to claim 10, wherein:

a filter is placed in the circulation passage;

the substrate holding unit includes a substrate holding part having a substrate holding member, and a shaft connected to the substrate holding part and extending along the rotational axis;

a part of the circulation passage is formed by a through hole extending through the shaft; and the filter is attached to the shaft at an end of the through hole.

12. The apparatus according to claim 10 further comprising a controller that varies operating speed of the motor when the processing fluid is circulated in the circulation passage.

* * * * *